United States Patent
Hoshi et al.

[19]

[11] Patent Number: 5,544,123
[45] Date of Patent: Aug. 6, 1996

[54] SEMICONDUCTOR MEMORY DEVICE HAVING A TEST CIRCUIT

[75] Inventors: Satoru Hoshi, Kawasaki; Masami Masuda, Yokohama, both of Japan

[73] Assignee: Kabushiki Kaisha Toshiba, Tokyo, Japan

[21] Appl. No.: 395,031

[22] Filed: Feb. 27, 1995

[30] Foreign Application Priority Data

Mar. 3, 1994 [JP] Japan .................................. 6-033680

[51] Int. Cl.$^6$ .............................. G11C 8/00; G11C 29/00
[52] U.S. Cl. .................... 365/230.06; 365/201; 371/21.1
[58] Field of Search ............................... 365/230.06, 201; 371/21.1, 21.2

[56] References Cited

U.S. PATENT DOCUMENTS 5,258,954  11/1993  Furuyama .................... 365/201
5,265,057  11/1993  Furuyama et al. .................... 365/201
5,287,312   2/1994  Okamura et al. .................... 365/201
5,303,193   4/1994  Ogihara .................... 365/201

Primary Examiner—David C. Nelms
Assistant Examiner—Son Dinh
Attorney, Agent, or Firm—Loeb & Loeb LLP

[57] ABSTRACT

A plurality of voltage supply circuits each including an inverter circuit are provided at the final stage of a row decoder. The voltage supply circuits are supplied with voltage Vdd and voltage Vxx. The voltage Vxx is set at a level of Vss in a normal operation mode and at a level higher than that of Vdd in a burn-in test mode. In the latter mode, the voltage Vdd is applied to the voltage supply circuit connected to a selected word line, while the voltage Vxx (higher than Vdd) is applied to the voltage supply circuit connected to a nonselected word line. All word lines are therefore set at a high level and rendered in a selective state.

18 Claims, 11 Drawing Sheets

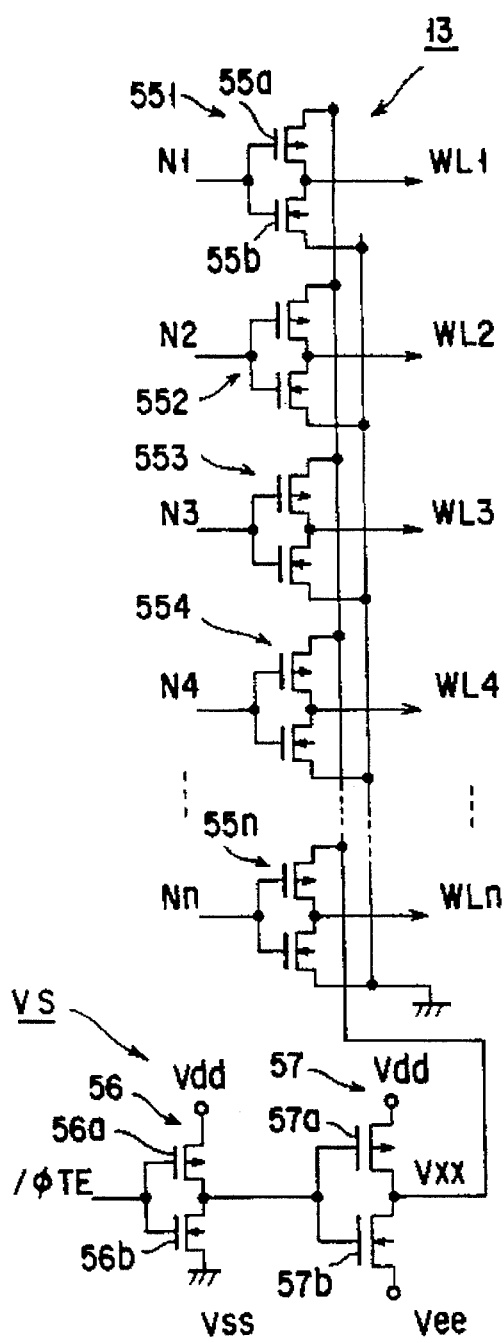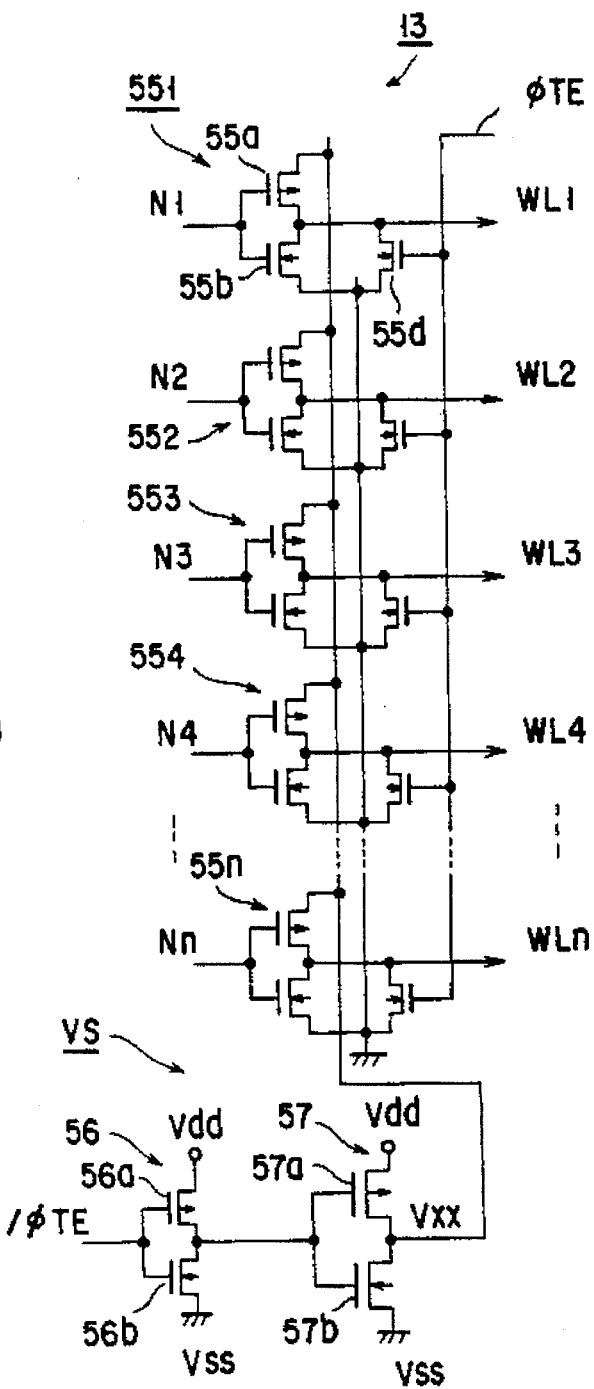
F I G. 7
F I G. 8

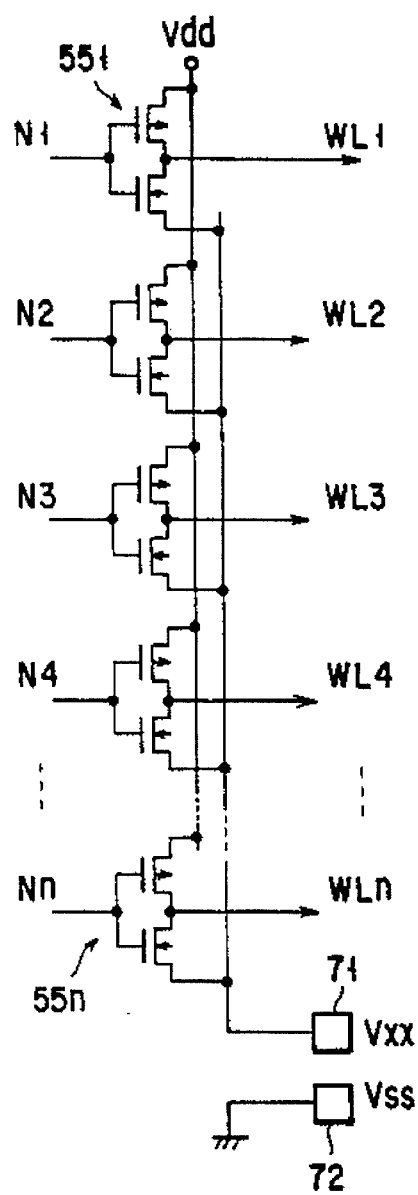
F I G. 9
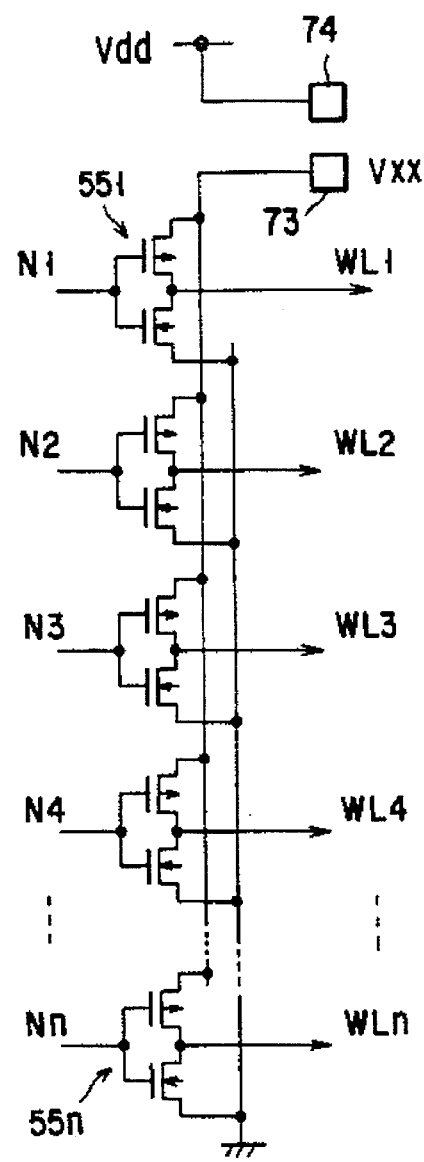
F I G. 11

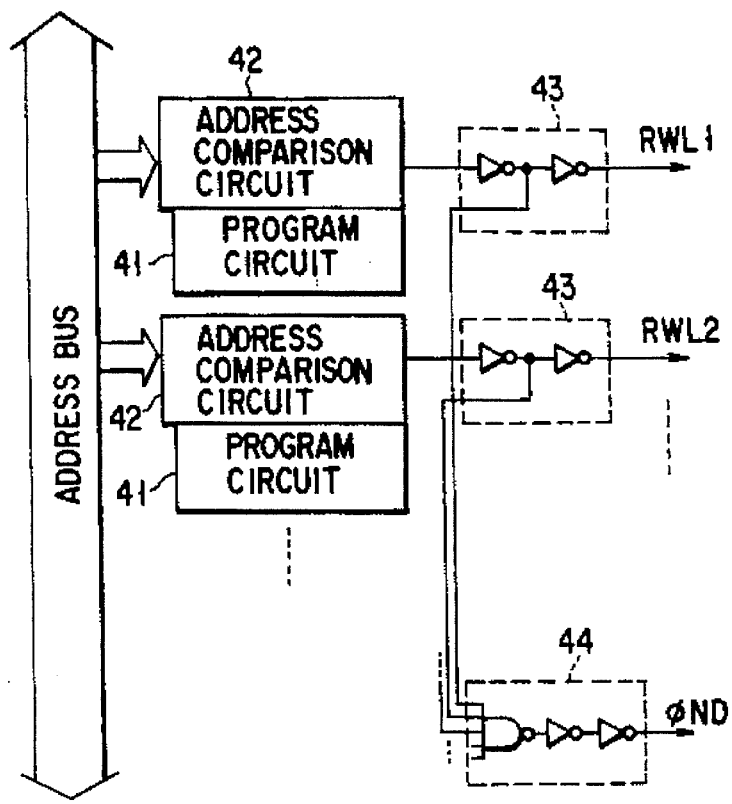
F I G. 15
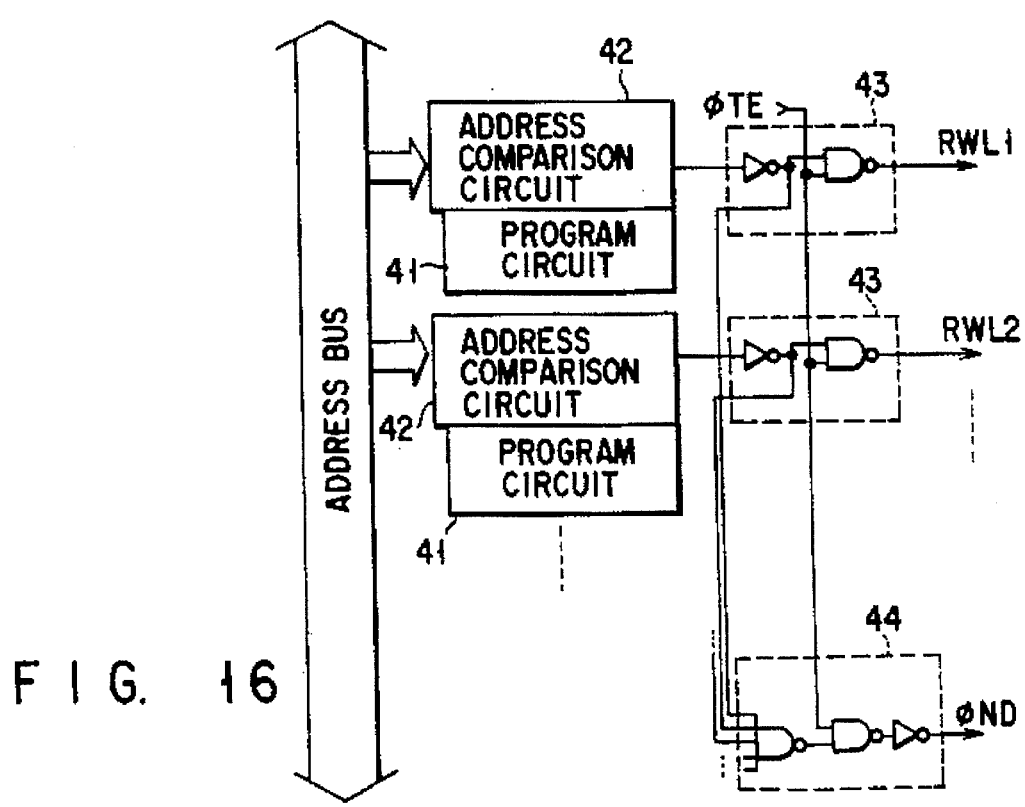
F I G. 16

SEMICONDUCTOR MEMORY DEVICE HAVING A TEST CIRCUIT

BACKGROUND OF THE INVENTION

1. Field of the Invention

The present invention relates to a semiconductor memory device having a test circuit suitable for a burn-in test for a static memory device and the like.

2. Description of the Related Art

Generally all semiconductor memory devices undergo a lifetime accelerated test called a burn-in test before they are shipped. The test aims at screening the initial, latent defects by applying a stress to all circuits of chips for a given period of time under the circumstances of the maximum values of high temperature and high-voltage power supply allowed within the specifications or the values thereof beyond them.

The amount of stress applied to memory cells during the burn-in test causes a problem as the memory cells increase in capacity. The burn-in test for the memory cells is carried out by applying a high field stress to a transistor of each of the cells to be selected. If, in the burn-in test, the stress is uniformly applied to all the memory cells within a given period of time, the time required for applying the stress to each cell decreases as the memory cells increase in number. If the amount of stress reduces, the lifetime accelerated test for defects cannot be performed completely, with the result that the primary objective of the burn-in test cannot be attained. To sufficiently obtain the effect of the burn-in test, the time required for the burn-in test has to be increased in proportion to the memory capacity.

The burn-in test is hindered by not only the memory capacity but also the other factors. One of them is an automatic power-down function incorporated into a semiconductor memory device. The objective of the function is to decrease the power consumption of a large-capacity memory when it is normally operated.

FIG. 12 schematically shows an asynchronous static memory incorporating an automatic power-down function. In this memory, when the logical level of a row address input changes, the selective states of an address buffer (ADB) 11, a row predecoder (RPDC) 12, and a row decoder (RDC) 13 change, and a word line corresponding to a new row address of a memory cell array (MCA) 14. Similarly, when the logical level of a column address input changes, an address buffer (ADB) 15, a column predecoder (CPDC) 16, and a column decoder (CDC) 17 operate, and a column switch corresponding to a new column address turns on. Data of memory cells selected by the row address and column address is transmitted to a sense amplifier (SA) 18 through a data line and then amplified. The amplified data is output from a data output terminal 21 through a data latch circuit (DL) 19 and a data output circuit (DO) 20 as new address data.

FIG. 13 schematically shows the ADB 11, RPDC 12, and RDC 13. In FIG. 13, the same elements as those of FIG. 12 are denoted by the same reference numerals. The circuit shown in FIG. 13 includes equivalents for the ADB 15, CPDC 16, and CDC 17 shown in FIG. 12.

In the circuit shown in FIG. 12, address transition detectors (ATD) 22 and 23 detect the transition of an address to generate a pulse signal $\phi$ATD, and an internal sync pulse generation circuit (ISPG) 24 operates to generate various types of internal pulse signals. For example, an internal pulse signal $\phi$DC is a signal for canceling the preceding address data remaining on the data line, and an internal pulse signal $\phi$TR is a signal for resetting a delay timer circuit (DTC) 25. The DTC 25 is reset in response to the signal $\phi$TR and then stops transmitting an automatic power-down signal $\phi$PD for a fixed period of time. More specifically, the DTC 25 receives the internal pulse signal $\phi$TR from the ISPG 24 in accordance with the transition of an address and stops transmitting the automatic power-down signal $\phi$PD for a preset period of time, that is, for a period of time necessary for outputting new address data. After the time passes, the DTC 25 returns and controls the RDC 13 and SA 18 to release the selection of a memory cell and stop the SA 18. The operation of the DTC 25 shortens the time for selecting a memory cell in the normal operation mode and decreases the power consumed by the memory cells and sense amplifier.

However, the power-down function causes a great problem in the burn-in test. Since the time for maintaining the selective state after a memory cell is selected is shortened by the automatic power-down function, the stress applied to the memory cell is greatly reduced, with the result that a memory having the automatic power-down function requires a very long time to sufficiently obtain the effect of the burn-in test.

To resolve the above drawback, a memory device having a function of rendering all memory cells in a selective state at the same time is developed. In this memory device, a logic circuit is added to a row decoder to render all outputs of the decoder in the selective state, and another logic circuit is added to an automatic power-down circuit to inhibit the automatic power-down function from being carried out.

FIG. 14 is a circuit diagram showing the circuit of FIG. 13 into which a function of simultaneously selecting all memory cells. The function will now be described, comparing FIGS. 13 and 14. In FIG. 14, A1 to A4 indicate address input terminals, $\phi$PD denotes an automatic power-down signal, and $\phi$ND shows a word line inhibit signal for inhibiting a word line connected to a normal memory cell from being selected when a redundant memory cell is selected. The signal $\phi$PD is normally at a low level, and maintains a high level for a given period of time after the transition of an address. The level of the signal $\phi$ND is kept at low when no redundant memory is used. The circuit of FIG. 14 differs from that of FIG. 13 in that the row predecoder 12 and row decoder 13 are controlled by a test enable signal /$\phi$TE (/indicates an inverted signal). The test enable signal /$\phi$TE is supplied to the row predecoder 12, and then to a NAND circuit 26, together with the automatic power-down signal $\phi$PD. The output signal of the NAND circuit 26 is supplied to the row decoder 13. The test enable signal /$\phi$TE is set at a high level in the normal operation mode and a low level in the burn-in test mode, and supplied from an external input terminal (not shown) or a detection circuit for detecting the burn-in test mode.

In the normal operation mode, in other words, when the level of the test enable signal /$\phi$TE is high, the operations of the circuits shown in FIGS. 13 and 14 are the same. In the circuit of FIG. 14, if the test enable signal /$\phi$TE is set to a low level in the burn-in test mode, the output signals of the row predecoder 12 are all set to a high level, in other words, all addresses are rendered in a selective state irrespective of the address input state.

The output signal of the NAND circuit 26 for receiving the test enable signal /$\phi$TE and automatic power-down signal $\phi$PD at the same time, is fixed to a high level, and the word lines are to be selected by the row decoder 13, irrespective of the state of the automatic power power-down signal φPD. If, as described above, the logic of the predecoder and row decoder is changed, the word lines of all the memory cells can be set in the selective state.

The above description of the row address is very true of the column address.

The above description the memory device is logically clear, and the device is excellent in that all the memory cells can be set in the selective state by simply modifying a logic circuit. Since, however, an additional logic circuit is included in a memory cell selecting system in the normal operation mode, it has an adverse influence on the operation speed of a memory device aiming at a high-speed operation.

In general, a large-capacity memory device includes redundant memory cells for compensating for defective ones. In this memory device, an electric stress has to be applied to the redundant memory cells in the burn-in test.

FIG. 15 shows an example of a control circuit for the redundant memory cells. A generally-used redundant memory cell control circuit includes a plurality of program circuits 41 for recording defective addresses, a plurality of comparison circuits 42 for comparing an input address and a programmed address, a plurality of selection circuits 43 for selecting redundant word lines RWL1, RWL2, ... connected to the redundant memory cells in response to the signals output from the comparison circuits 42, and a generation circuit 44 for generating the above-described word line inhibit signal φND. In order to forcibly select all the memory cells in the burn-in test mode in the control circuit, the selection circuits 43 and generation circuit 44 have to be controlled by the test enable signal φTE, as in the circuit shown in FIG. 16. Therefore, in the normal operation mode, a large timing margin is needed in the transition from an address of a defective memory cell to that of a normal one, with the result that great restrictions are imposed on the circuit in order to secure an operation margin.

SUMMARY OF THE INVENTION

It is accordingly an object of the present invention to provide a semiconductor memory device capable of simultaneously selecting all memory cells in the burn-in test mode, without decreasing in operation speed in the normal operation mode, and shortening the time required for the burn-in test.

To attain the above object, there is provided a semiconductor memory device comprising:

a plurality of logic circuits for decoding an address signal, each of the logic circuits outputting a decode signal from an output terminal thereof to select a memory cell; and a plurality of voltage supply circuits each having an input terminal connected to the output terminal of each of the logic circuits and an output terminal connected to a word line for selecting the memory cell, each of the voltage supply circuits having a first voltage input terminal supplied with a first voltage and a second voltage input terminal supplied with a second voltage which is lower than the first voltage, each of the voltage supply circuits supplying the first voltage to the word line when the decode signal represents a selective state of the memory cell and supplying the second voltage to the word line when the decode signal represents a non-selective state thereof, the second voltage being set at a level which is equal to a level of the first voltage in a test mode where the semiconductor memory device is tested.

According to the present invention, the first and second voltages are applied to the voltage supply circuits provided at the final stage of the decoder. The second voltage is set at a level opposite to that of the first voltage in the normal operation mode, and at a level equal to or higher than that of the first voltage. Therefore, in the normal operation mode, the voltage supply circuits do not decrease the access speed of the memory and set all memory cells in a selective state at once, thereby shortening the time required for the test.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a circuit diagram showing a modification to the circuit of FIG. 4 as a seventh embodiment;

FIG. 8 is a circuit diagram showing a modification to the circuit of FIG. 5 as an eighth embodiment;

FIG. 9 is a circuit diagram showing the main part of a circuit according to a ninth embodiment of the present invention;

FIG. 11 is a circuit diagram showing a modification to the circuit of FIG. 9;

FIG. 15 is a circuit diagram showing an example of a control circuit for redundant memory cells; and FIG. 16 is a circuit diagram showing the circuit of FIG. 15 incorporating a function of simultaneously selecting all memory cells.

DETAILED DESCRIPTION OF THE PREFERRED EMBODIMENTS

Embodiments of the present invention will now be described, with reference to the accompanying drawings.

Figure 1:
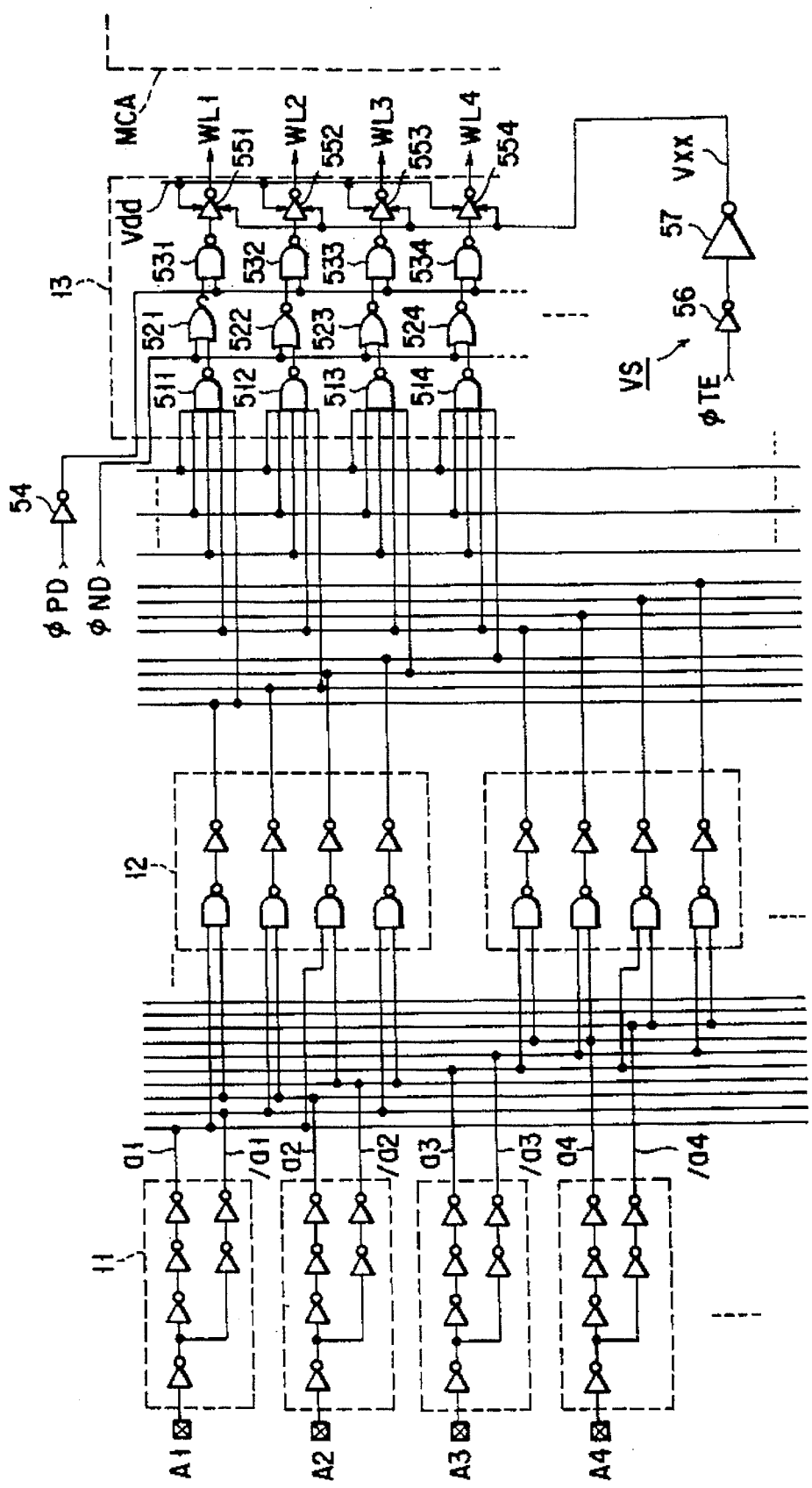
FIG. 1 is a circuit diagram showing the main part of a circuit according to a first embodiment of the present invention.
Figure 13:
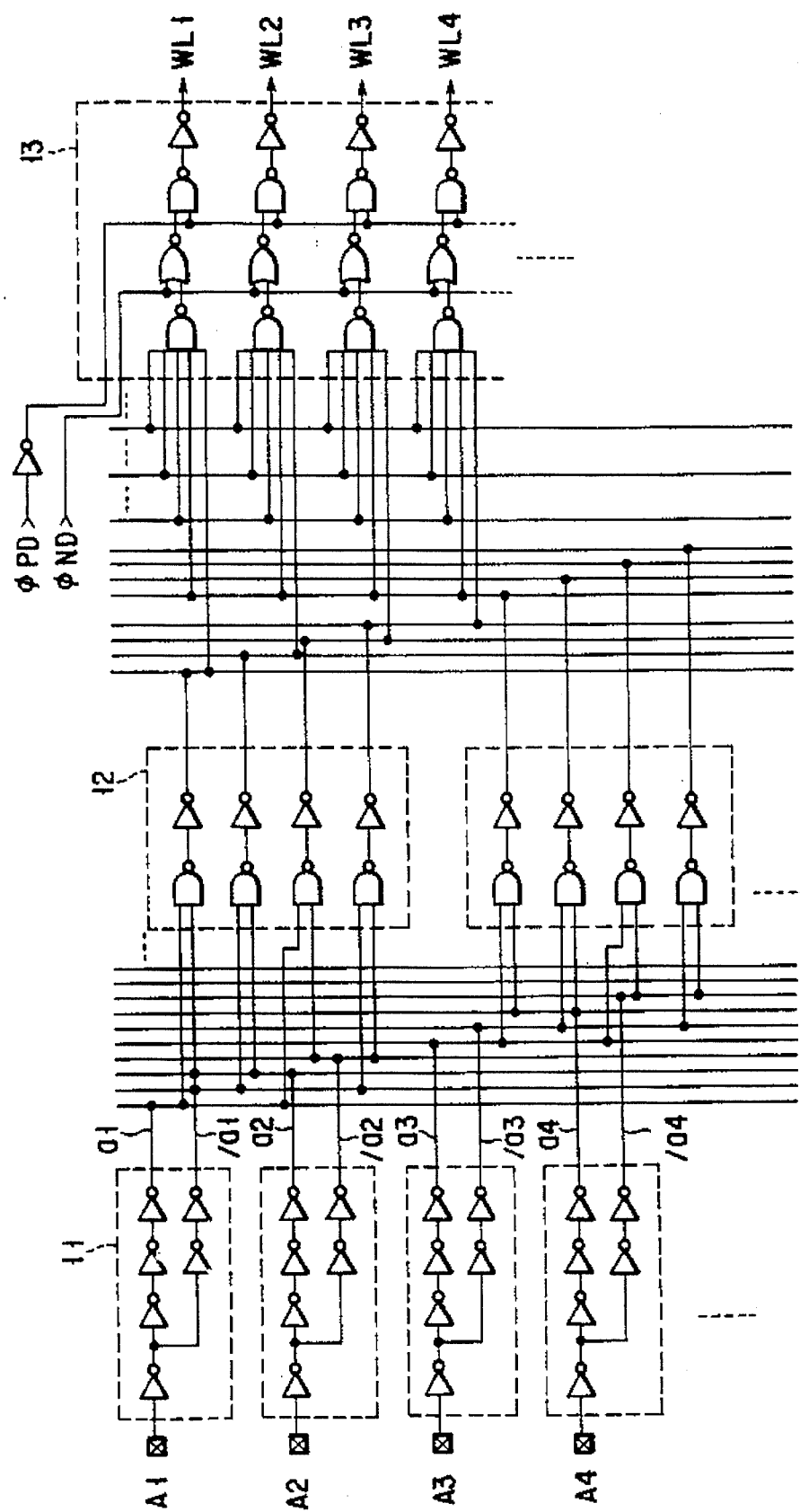
FIG. 13 is a circuit diagram showing a prior art decode circuit.
Figure 14:
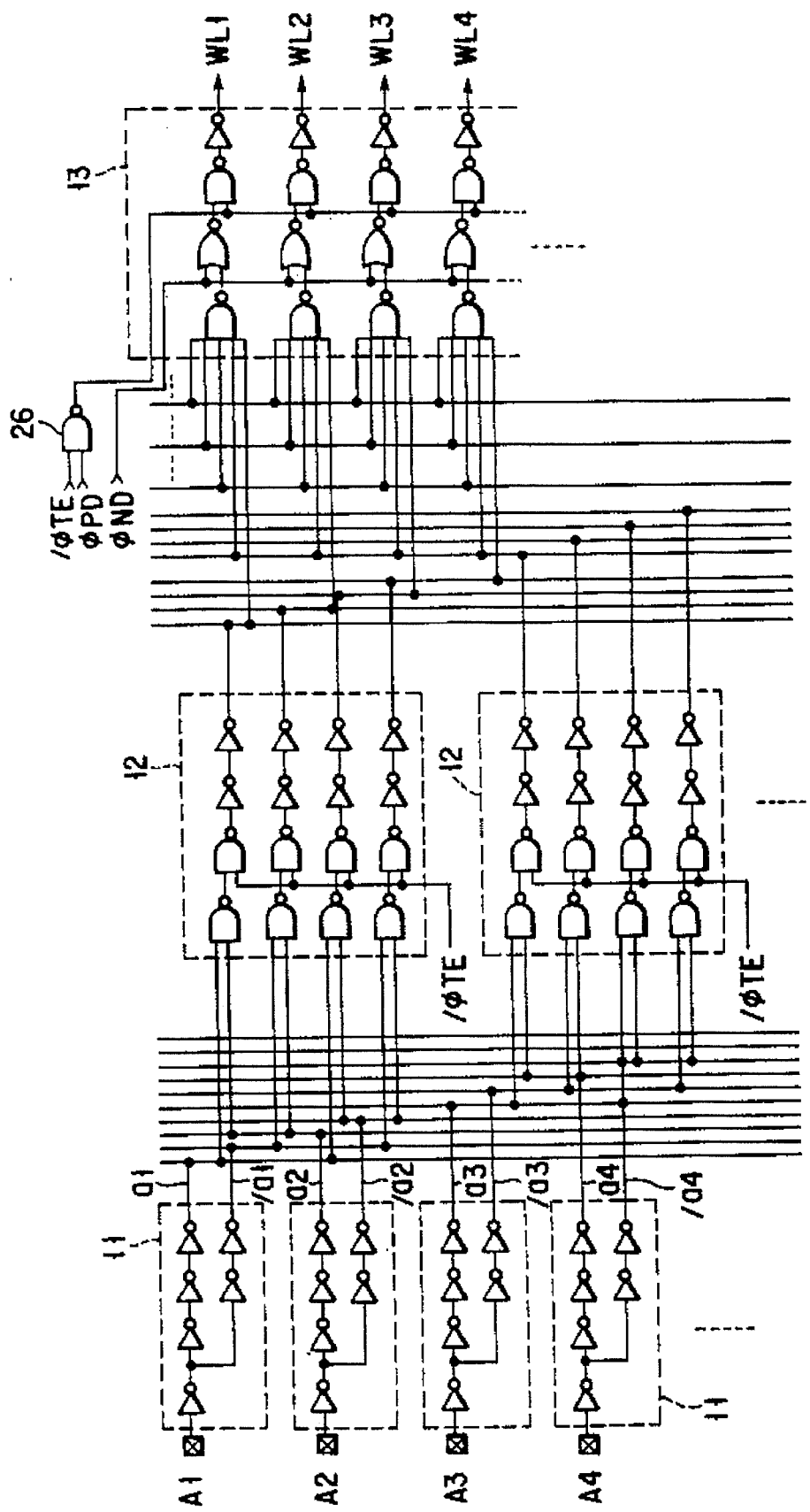
FIG. 14 is a circuit diagram showing the decode circuit of FIG. 13 incorporating a function of simultaneously selecting all memory cells.

FIG. 1 shows a first embodiment of the present invention. In FIG. 1, the same structural elements as those of FIG. 13 are indicated by the same reference numerals. The arrangement of a row decoder 13 shown in FIG. 1 differs from that of the row decoder shown in FIG. 13. In the row decoder 13, the output terminals of a plurality of NAND circuits 511, 512, . . . which receive the output signals of a row predecoder 12, are connected to the input terminals of a plurality of NOR circuits 521, 522, . . . , respectively. The other input terminals of the NOR circuits 521, 522, . . . are supplied with word line inhibit signals φND. Each of output terminals of these NOR circuits are connected to its corresponding one of input terminals of each of a plurality of NAND circuits 531, 532, . . . The other input terminals of the NAND circuits 531, 532, . . . are supplied with automatic power-down signals φPD inverted by an inverter circuit 54. The output terminals of the NAND circuits 531, 532, . . . are connected to the input terminals of voltage supply circuits 551, 552, . . . constituted of, for example inverter circuits. These voltage supply circuits are supplied with voltages Vdd and Vxx, and supplies one of the voltages Vdd and Vxx to word lines WL1, WL2, . . . in response to the output signals of the NAND circuits 531, 532, . . . . Unlike the voltage supply circuits 551, 552, . . . , the NAND circuits 511, 512, . . . , NOR circuits 521, 552, . . . , and NAND circuit 531, 532, are supplied with the voltage Vdd and ground potential.

The voltage Vxx is generated by a voltage switching circuit VS. The circuit VS is constituted of series-connected inverter circuits 56 and 57. The input terminal of the inverter circuit 56 is supplied with a test enable signal φTE. The inverter circuit 57 is formed of a transistor whose gate is larger than that of a transistor of the inverter circuit 56, and its current supply capability is high.

Figure 2:
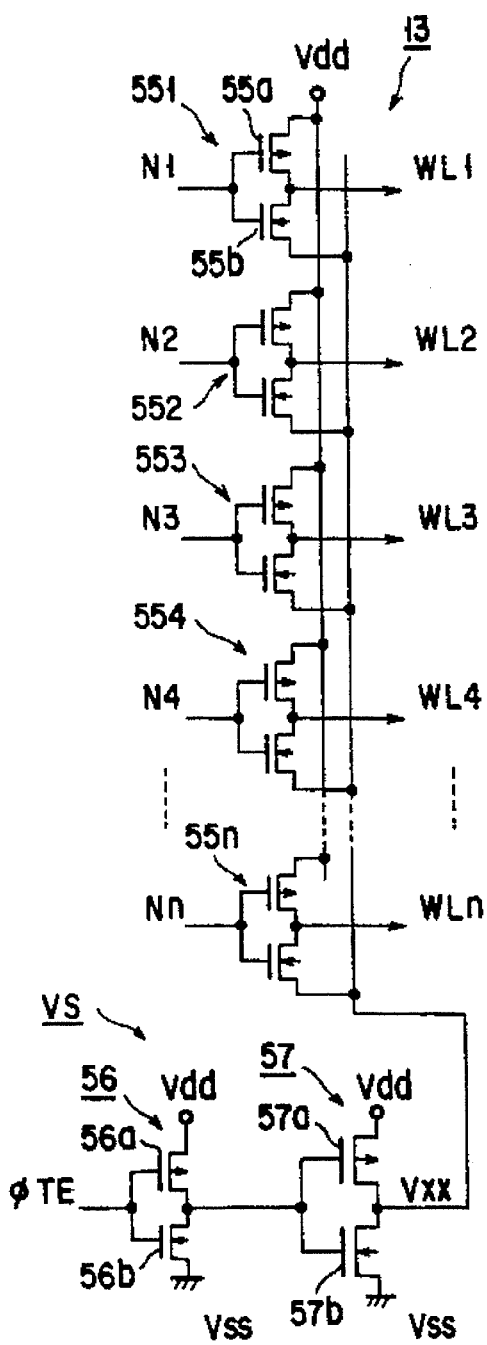
FIG. 2 is a circuit diagram specifically showing the main part of the circuit of FIG. 1 as a second embodiment.

FIG. 2 shows a second embodiment of the present invention and specifically shows the voltage supply circuits 551 to 55n and voltage switching circuit VS. The gates of a P-channel transistor 55a and an N-channel transistor 55b constituting each of the voltage supply circuits are supplied with each of row decode signals N1, . . . , Nn output from a NAND circuit on the preceding stage, and the drains thereof are connected to each of word lines WL1, WL2, . . . , WLn. While the source of the P-channel transistors 55a is supplied with the voltage Vdd, that of the N-channel transistor 55b is supplied with Vxx.

The gates of a P-channel transistor 56a and an N-channel transistor 56b constituting the inverter circuit 56 are supplied with a test enable signal φTE, and the drains of these transistors 56a and 56b are connected to the gates of a P-channel transistor 57a and an N-channel transistor 57b constituting the inverter circuit 57. The sources of the P-channel transistors 56a and 57a are supplied with voltage Vdd, and the drains of the N-channel transistors 56b and 57b are supplied with ground voltage Vss. The drains of the P- and N-channel transistors 57a and 57b are connected to the source of each of the N-channel transistors 55b.

An operation of the above circuit arrangement will now be described. In the normal operation mode, the test enable signal φTE is set at a low level. Then the output node of the inverter circuit 56 is high, and the transistor 57b of the inverter circuit 57 remains in an on-state. Since, therefore, the output signal of the inverter circuit 57, i.e., the voltage Vxx is equal to the ground potential Vss, the voltage supply circuits 551 to 55n operate as normal inverter circuits. If the row decode signal N1 output from a NAND circuit 541 on the preceding stage is set at, e.g., a low level and the row decode signals N2, N3, . . . , Nn output from the other NAND circuits 542, . . . , are set at a high level, the P-channel transistor 55a of the voltage supply circuit 551 is turned on, and the P-channel transistors 55a of the voltage supply circuits 552 to 55n are turned off. Thus, the word line WL1 is set to a high level in the selective state, and the other word lines WL2 to WLn are set to a low level in the non-selective state, with the result that it is understood that the decode operation of an address is secured in the normal operation mode.

An operation of the above circuit in the burn-in test mode in which the test enable signal φTE is set at a high level, will now be described. In this mode, the output signal of the inverter circuit 56 is set at a low level, and the transistor 57b is turned on, whereas the transistor 57a is turned off. As a result, the output signal of the inverter circuit 57, that is, the voltage Vxx is changed to the voltage Vdd. If the row decode signal N1 output from the NAND circuit 541 is set at, e.g., a low level and the row decode signals N2, N3, Nn output from the other NAND circuits 542, . . . , are set at a high level, the P-channel transistor 55a of the voltage supply circuit 551 is turned on, and the N-channel transistor 55b thereof is turned off. Thus, the word line WL1 is set to a high level by the P-channel transistor 55a. The P-channel transistors of the voltage supply circuits 552 to 55n are turned off, and the N-channel transistors thereof are turned on. The word lines WL2 to WLn are charged to the voltage Vxx or a high level by the N-channel transistors. As described above, in the burn-in test mode, all the word lines are charged to a high level, irrespective of the states of input address signals, with the result that an electric stress can be applied to all memory cells.

The foregoing operation is also effective in a memory device in which defective memory cells are saved by redundant memory cells. Since the word line inhibit signal φND is set at a high level when the defective memory cells are saved, the output signals of the NOR circuits 521, 522, . . . shown in FIG. 1 are all set at a high level. Therefore, if the level of the output signal of the inverter circuit 54 becomes low in response to the power-down signal φPD, the row decode signals N1, N2, . . . , Nn output from the NAND circuits 531, 532, . . . are all set at a high level. The N-channel transistors of the voltage supply circuits 551 to 55n connected to the word lines WL1, WL2, . . . , WLn, and all the word lines are charged to the voltage Vxx or a high level by these N-channel transistors. Simultaneously, the same voltage supply circuits as the circuits 551 to 55n are provided at the final-stage row decoder for the redundant memory cells and supplied with the voltage Vxx, with the result that all the word lines for the redundant memory cells can be selected.

According to the above embodiment, all the memory cells can be selected at once in the burn-in test mode without decreasing the operation speed in the normal operation mode. As illustrated in FIG. 13, neither selection circuit 43 nor generation circuit 44 has to be controlled in response to the test enable signal φTE; accordingly, the time required for the burn-in test can be shortened.

Figure 3:
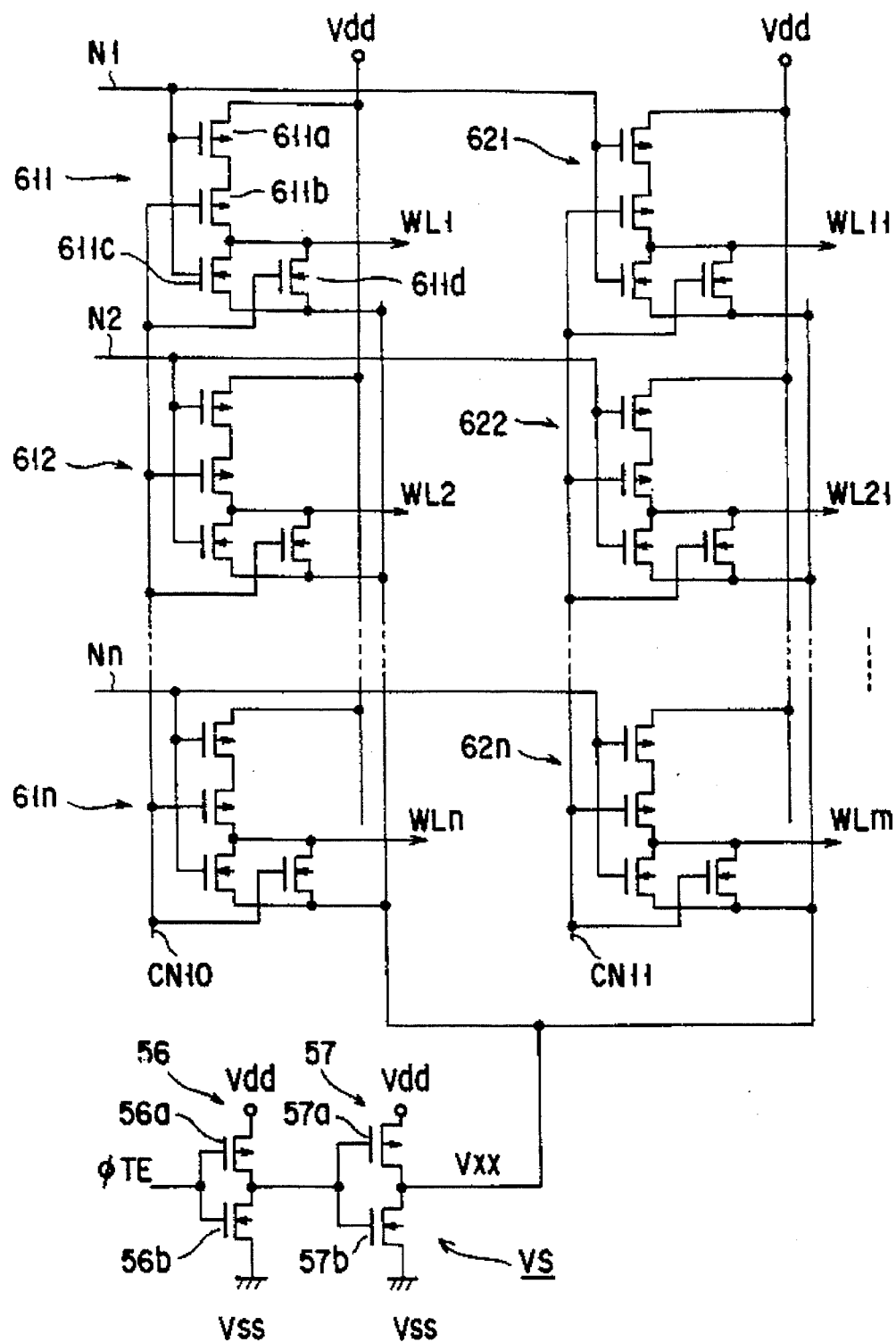
FIG. 3 is a circuit diagram showing the main part of a circuit according to a third embodiment of the present invention.

FIG. 3 shows a third embodiment of the present invention and, more specifically, a two-input logic circuit of the voltage supply circuit provided on the final-stage row decoder. In FIG. 3, the same structural elements as those of FIG. 2 are denoted by the same reference numerals.

Voltage supply circuits 611, 612, . . . , 61n are supplied with row decode signals N1, N2, . . . , Nn and a column decode signal CN10 output from the precedingstage NAND circuits 531, 532, . . . (not shown), and voltage supply circuits 621, 622, . . . , 62n are supplied with row decode signals N11, N21, . . . , Nm and a row decode signal CN11 output from the preceding-stage NAND circuits (not shown). These voltage supply circuits 611 to 61n and 621 to 62n are each constituted of a two-input NOR circuit and have substantially the same constitution; therefore, the constitution will be described, with respect to the voltage supply circuit 611.

The current paths of P-channel transistors 611a and 611b are connected in series to each other. The gate of the transistor 611a is supplied with a row decode signal N1, and the source thereof is supplied with a voltage Vdd. The drain of the transistor 611a is connected to the source of the transistor 611b. The gate of the transistor 611b is supplied with a column decode signal CN10, and the drain thereof is connected to the drains of parallel-connected N-channel transistors 611c and 611d and the word line WL1. The gate of the transistor 611c is supplied with the row decode signal N1, and that of the transistor 611d is supplied with the column decode signal CN10. The sources of these transistors 611c and 611d are supplied with the voltage Vxx. The voltage Vxx is supplied from the inverter circuit 57.

An operation of the voltage supply circuit having the above arrangement will be described. In the normal operation mode, the test enable signal φTE is low in level, and the voltage Vxx output from the inverter circuit 57 is set at the ground potential Vss. If the row decode signal N1 is at a low level, the other row decode signals N2 to Nn are at a high level, the column decode signal CN10 is at a low level, and the column decode signal CN11 is at a high level, the seriesconnected P-channel transistors 611a and 611b of the voltage supply circuit 611 are both turned on, and the word line WL1 is selected. Therefore, the word line WL1 is supplied with the voltage Vdd and set at a high level.

In the other voltage supply circuits 612 to 61n and 621 to 62n, one or both of parallel-connected N-channel transistors is/are turned on. The word lines WL2 to WLn and WL11 to WLm are rendered in a non-selective state and set at a low level (ground potential Vss).

when the column decode signals N10 and N11 and power-down signal φPD are ANDed to generate signals N10 and N11, the signal N10 is changed to a high level after a lapse of a predetermined period of time in response to the power-down signal φPD. The level of the word line WL1 thus becomes low in the selective state.

An operation of the above circuit in the burn-in test mode will now be described. when the test enable signal φTE is set at a high level, the voltage Vxx output from the inverter circuit 57 is set at the level of the voltage Vdd. In each of the voltage supply circuits 61l to 61n and 62l to 62n, a selected word line is set at a high level through the series-connected P-channel transistors, and a non-selected word line is set at a high level through one or both of the parallel-connected N-channel transistors.

Even though the word line selected by the powerdown function is rendered in a non-selective state, the high-level signal, which is supplied through the P-channel transistors in the selection mode, is supplied from one of the parallel-connected N-channel transistors. It is thus possible to continue applying an electric stress to all memory cells.

In the second embodiment described above, the voltage supply circuit is constituted of a two-input NOR circuit; however, the number of inputs and the type of logic gates are not limited to the embodiment. A selected word line can be supplied with the voltage Vdd through a current path of at least one transistor, and a non-selected word line can be supplied with a ground potential Vss through a current path of at least one transistor.

Since the first and second embodiments employ an enhancement type N-channel transistor to supply the voltage Vdd to the non-selected word line, the level of the non-selected word line is increased only to Vdd - vth(N) which is lower than the voltage Vdd, where Vth(N) is a threshold voltage of the N-channel transistor. Consequently, the time required for sufficiently applying a stress to the word lines is somewhat lengthened. Since, furthermore, the word line selected by the P-channel transistor is charged to the level of the voltage Vdd, there occurs a problem of an imbalance in the applied voltage.

Figure 4:
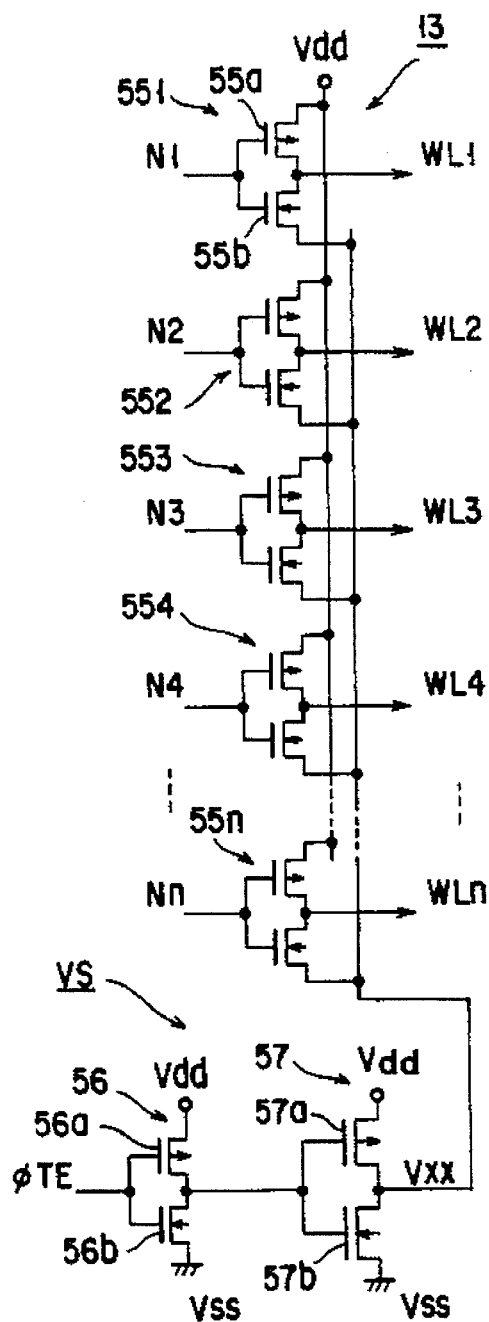
FIG. 4 is a circuit diagram showing the main part of a circuit according to a fourth embodiment of the present invention.

FIG. 4 shows a fourth embodiment which resolves the above problem. In FIG. 4, the same elements as those of FIG. 2 are indicated by the same reference numerals. According to the fourth embodiment, a voltage Vxx is set higher than a voltage Vdd, so that a word line selected by an enhancement type N-channel transistor can be charged to the voltage Vdd in the burn-in test mode, and the lifetime can be accelerated.

As shown in FIG. 4, the source of a P-channel transistor constituting an inverter circuit 57 is supplied with a voltage vpp which is higher than the voltage Vdd. For example, an N well bias power supply can be used as the voltage Vpp in order to reduce the parasitic junction capacitance between $P^+$ and N wells. The level of the voltage Vpp has to satisfy the following conditions:

$$Vpp \approx Vdd + Vth(N) \quad (1)$$

$$Vpp \leq Vdd + Vth(N) + |Vth(P)| \quad (2)$$

The formula (1) represents that the level "Vpp–Vth(N)" of a word line charged by the N-channel transistor has to be set in the vicinity of that of the voltage Vdd, while the formula (2) shows that, when a non-selected word line is charged to the level "Vpp–Vth(N)" by the N-channel transistor, the level does not exceed the level "Vdd+|Vth(P)|". If the word line is charged exceeding the level, the P-channel transistor is turned on, and a leak current is caused to flow from the voltage Vpp to the voltage Vdd through all inverter circuits in the non-selected state.

According to the foregoing fourth embodiment, when the voltage vpp satisfies the above conditions, all the word lines can be charged to the voltage Vdd in the burn-in test mode. Consequently, the time required for a burn-in test can be shortened and an electric stress can be applied sufficiently to all the word lines.

Figures 5, 6:
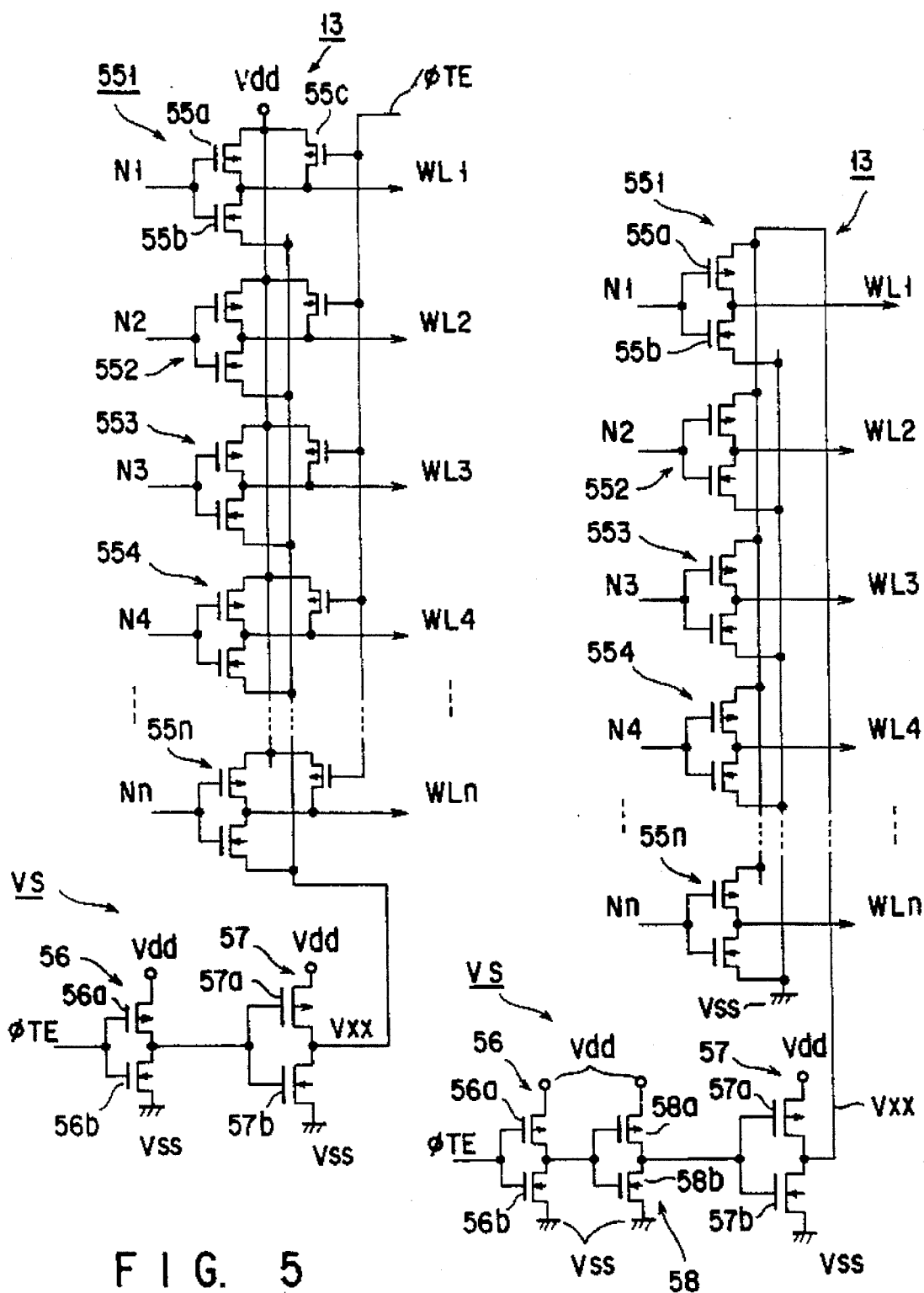
FIG. 5 is a circuit diagram showing the main part of a circuit according to a fifth embodiment of the present invention.
FIG. 6 is a circuit diagram showing the main part of a circuit according to a sixth embodiment of the present invention.

FIG. 5 shows a fifth embodiment of the present invention. In the fifth embodiment, P-channel transistors 55c are added to the respective voltage supply circuits 551 to 55n shown in FIG. 2 in order to charge the word lines. The P-channel transistors 55c are connected in parallel to the P-channel transistors 55a of the voltage supply circuits 551 to 55n. The gates of the P-channel transistors 55c are supplied with a test enable signal /φTE. The P-channel transistors 55c are intended to perform an auxiliary operation for charging the level "Vdd–Vth(N)" of the word line charged by the N-channel transistor 55b to the level of the voltage Vdd, and do not require a large current driving capacity. Therefore, the gates of the P-channel transistors 55c can be considerably decreased in size, and have little influence on the pattern size. In FIG. 5, the same elements as those of FIG. 2 are denoted by the same reference numerals.

According to the circuit arrangement shown in FIG. 5, in the normal operation mode, a test enable signal /φTE is fixed to a high level, and thus the P-channel transistors 55c are turned off. As described above, since the gate size of the transistors 55c is considerably small, an increase in parasitic capacitance of the transistors on the word lines can be ignored. In the normal operation mode, therefore, the transistors 55c do not interfere in the transistors 55a and 55b.

In the burn-in test mode, the test enable signal /φTE is set at a low level, and the P-channel transistors 55c are turned on accordingly. Like in the second embodiment shown in FIG. 2, a selected word line is charged to the level of voltage Vdd by the P-channel transistors 55a and 55c. A nonselected word line is charged to the level of "Vdd–Vth(N)" by the N-channel transistors 55b, and to the level of voltage Vdd by the P-channel transistors 55c.

Generally N-channel transistors are used as switching elements for connecting memory cells or connecting memory cells and bit lines. The word lines are therefore selected by positive logic. In the above first to fourth embodiments, the word lines selected by positive logic are described. However, the present invention can be applied to word lines selected by negative logic or column selection signals of negative logic.

FIG. 6 is a circuit diagram according to a sixth embodiment of the present invention and specifically shows word lines selected by negative logic. Comparing it with the second embodiment shown in FIG. 2, the sources of the P-channel transistors 55a are supplied with voltage Vxx and those of the N-channel transistors 55b are supplied with ground potential Vss in the voltage supply circuits 551 to 55n, in accordance with the inversion of logic.

The number of logic stages of a voltage switching circuit is odd. In other words, an inverter circuit 58 is interposed between inverter circuits 56 and 57 and constituted of a P-channel transistor 58a and an N-channel transistor 58b.

In the above circuit arrangement, the voltage Vxx is set equal to the level of the voltage Vdd in the normal operation mode in which the level of the test enable signal φTE is low. Therefore, the source of the P-channel transistor of each voltage supply circuit is supplied with the voltage Vdd, and the voltage supply circuit operates as a normal inverter.

If the test enable signal φTE is set at a high level in the burn-in test mode, the voltage Vxx is set equal to the level of the ground potential Vss. Therefore, the selected word line is set at the level of the ground potential Vss by the N-channel transistor of the voltage supply circuit, and the non-selected word line is set at the level of the ground potential Vss by the P-channel transistor thereof. In other words, all the word lines are set in the selective state.

The circuit of the third embodiment shown in FIG. 3 can be constituted as a circuit of negative logic, as can be the circuit of the sixth embodiment.

FIG. 7 is a circuit diagram according to a seventh embodiment of the present invention, in which the fourth embodiment shown in FIG. 4 is applied to the word lines selected by the negative logic. In FIG. 7, the same elements as those of FIG. 4 are indicated by the same reference numerals. Referring to FIG. 7, the source of an N-channel transistor 55b of each of voltage supply circuits 551 to 55n is grounded, and that of a P-channel transistor 55a thereof is connected to the output terminal of an inverter circuit 57. The source of a P-channel transistor 57a of the inverter circuit 57 is supplied with voltage Vdd, and that of an N-channel transistor 57b thereof is supplied with voltage Vee. Furthermore, the input terminal of an inverter circuit 56 of a voltage switching circuit VS is supplied with a test enable signal /φTE. The level of the voltage Vee has to satisfy the following two conditions.

$$Vee \approx Vss - |Vth(P)| \quad (3)$$

$$Vee \leq Vss - |Vth(P)| - Vth(N) \quad (4)$$

FIG. 8 is a circuit diagram according to an eighth embodiment of the present invention, in which the fifth embodiment shown in FIG. 5 is applied to the word lines selected by the negative logic. In FIG. 8, the same elements as those of FIG. 5 are denoted by the same reference numerals. Referring to FIG. 8, the source of an N-channel transistor 55b of each of voltage supply circuits 551 to 55n is grounded, and that of a P-channel transistor 55a thereof is connected to the output terminal of an inverter circuit 57. An N-channel transistor 55d is connected in parallel to the N-channel transistor 55b, and the gate of the N-channel transistor 55d is supplied with a test enable signal φTE. Furthermore, the input terminal of an inverter circuit 56 of a voltage switching circuit vS is supplied with the test enable signal /φTE.

In the voltage switching circuit VS applied to the present invention, the internal resistance of the inverter circuit 57 which generates the voltage Vxx, needs to be considerably lower. A case where the word lines are driven by the positive logic in the inverter circuit 57, will now be described. In this case, in particular, the current supply capability of an N-channel transistor 57b, which supplies the ground potential Vss to a non-selected word line in the normal operation mode, has to be increased. More specifically, the W/L (W: channel width, L: channel length) of the transistor 57b is considered to be several-thousands to several tens of thousands times as large as that of the other transistors. If transistors having a large gate are arranged on one spot of a memory chip, the size of the chip is increased. If, however, a number of N-channel transistors 57b are arranged in a free area of the chip and connected in parallel to one another, they have no influence upon the chip size, and a transistor with a large gate can thus be achieved when the word lines are driven by the negative logic, the P-channel transistor 57a, which supplies the voltage Vdd as voltage Vxx, can be arranged as described above.

The circuits of the embodiments shown in FIGS. 2 to 8 include a voltage switching circuit VS; however, it is not always needed.

FIG. 9 is a circuit diagram according to a ninth embodiment of the present invention, in which a voltage Vxx is supplied from outside a semiconductor chip.

Figure 10:
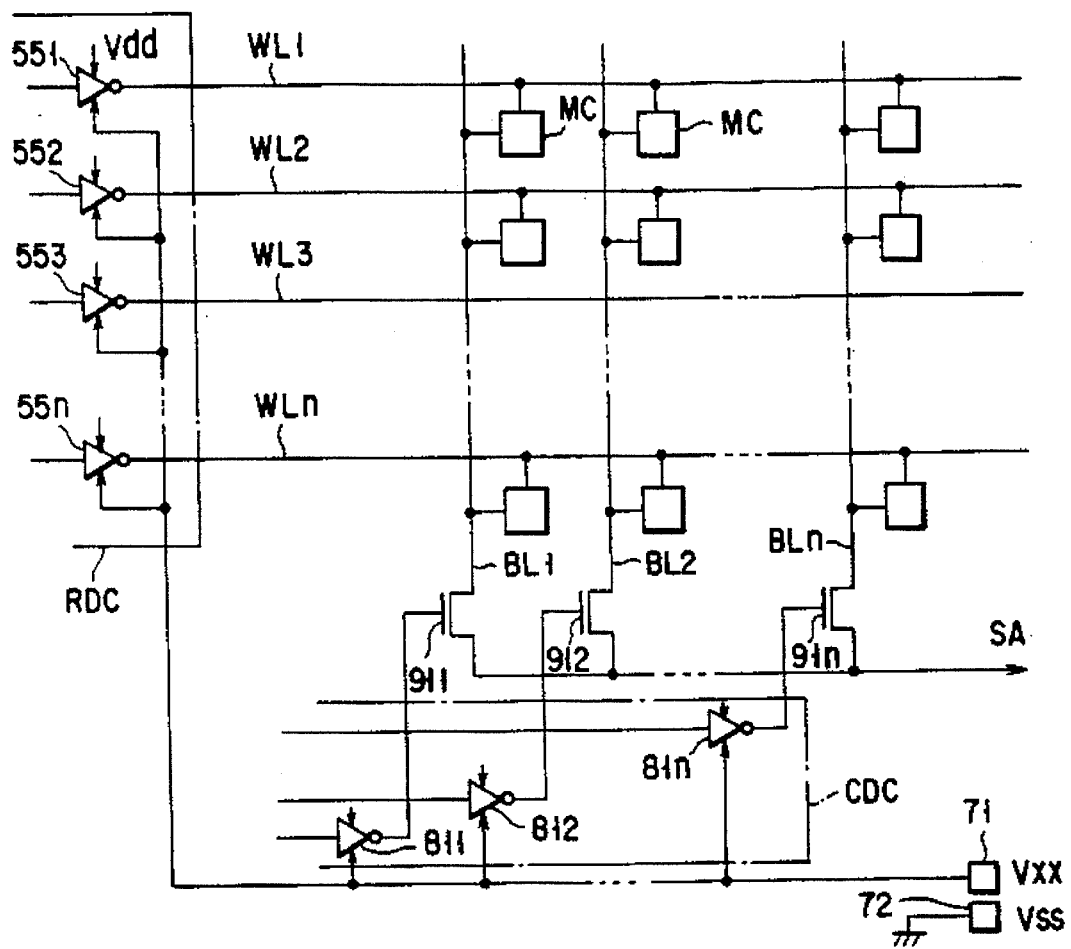
FIG. 10 is a circuit diagram showing a memory device to which the ninth embodiment of FIG. 9 is applied.
Figure 12:
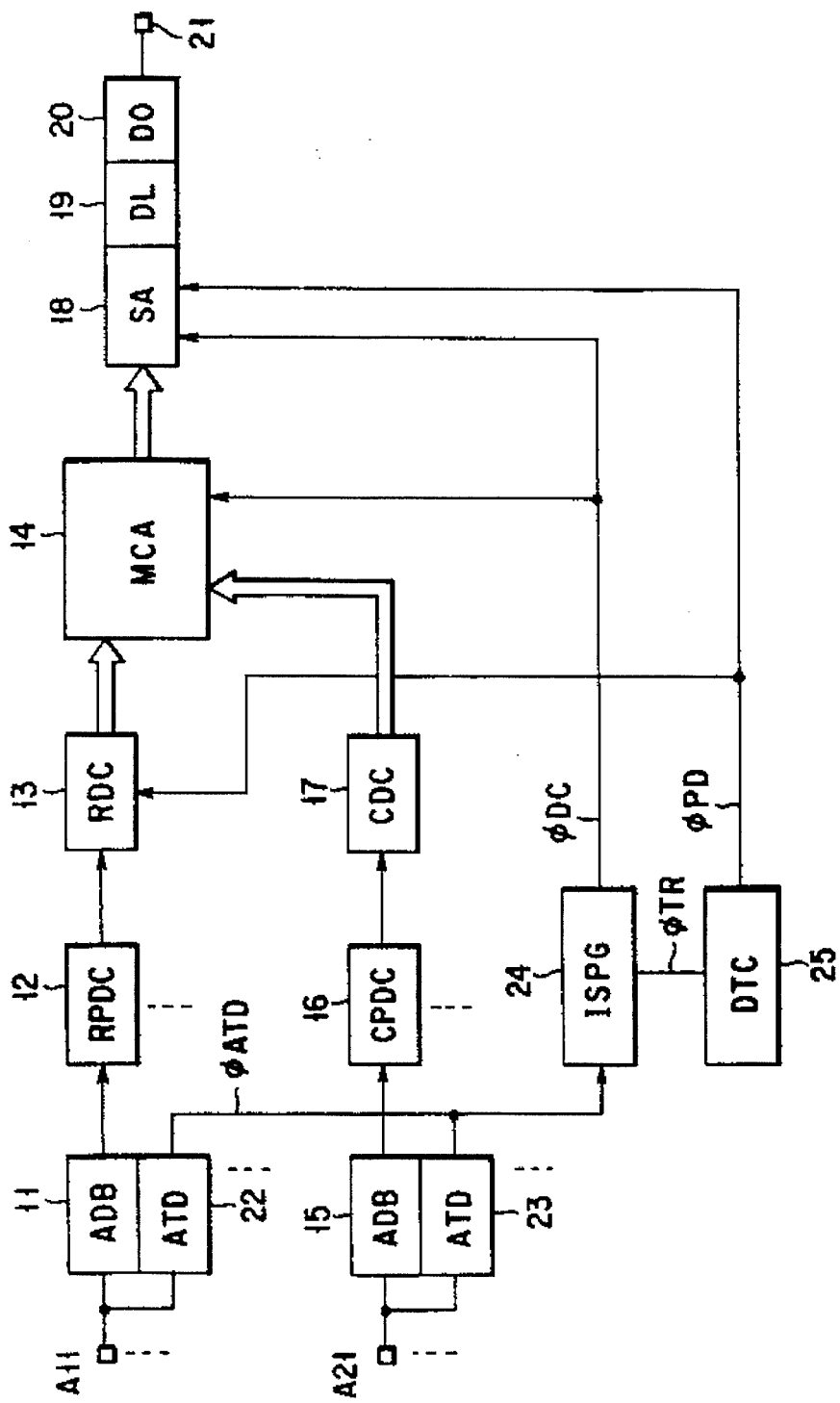
FIG. 12 is a view schematically showing the arrangement of an asynchronous static memory.

As shown in FIGS. 9 and 10, a pad 71 is connected to the source of an N-channel transistor of each of voltage supply circuits 551 to 55n. A pad 72 connected to the ground potential Vss, is formed in the vicinity of the pad 71. In FIG. 10, inverter circuits 811, 812, . . . , 81n provided at the final stage of a column decoder CDC, are connected to the pad 71. The output terminals of these inverter circuits are connected to bit lines BL1, BL2, . . . , BLn, respectively, through transistors 911, 912, . . . , 91n serving as column switches.

When a burn-in test is carried out in the circuit arrangement shown in FIGS. 9 and 10, the power supply voltage Vpp shown in FIG. 4 is externally supplied to the pad 71 as a voltage Vdd. The burn-in test can thus be performed with all memory cells MC in a selective state. If the burn-in test is carried out on a wafer and then a die sort test is by supplying the pad 71 with a ground potential Vss, test efficiency can be greatly improved.

When chips are assembled after the above tests, if the pads 71 and 72 are bonded to a pin to which the ground potential Vss of a lead frame is applied, a normal operation can be assured after the assembly.

If the package of a memory device has a plurality of pads for ground potential Vss, it is provided with a power supply pin exclusively for a voltage Vxx, the power supply pin is biased to the ground potential Vss in the normal operation mode, and the power supply pin is supplied with the voltage Vxx when the need arises. Therefore, all memory cells can be arbitrarily selected even after the assembly.

FIG. 11 shows a modification to the circuit of FIG. 9, in which word lines are driven by negative logic. In FIG. 11, the same structural elements as those of FIG. 9 are indicated by the same reference numerals. Referring to FIG. 11, the source of each N-channel transistor of voltage supply circuits 55₁ to 55n is grounded, and that of each P-channel transistor is connected to a pad 73 which is externally supplied with a voltage Vxx. A pad 74, which is supplied with a voltage Vdd lower than the ground potential, is disposed in the vicinity of the pad 73. In the burn-in test mode, the voltage Vxx supplied to the pad 73 is set to a voltage Vee lower than the ground potential. In the normal operation mode, it is set to the voltage Vdd. In other words, the pad 73 is connected to the pad 74 in the normal operation mode.

What is claimed is:

1. A semiconductor memory device comprising:

a plurality of logic circuits for decoding an address signal, each of said logic circuits outputting a decode signal from an output terminal thereof to select a memory cell; and a plurality of voltage supply circuits each having an input terminal connected to the output terminal of a corresponding one of said plurality of logic circuits and an output terminal connected to a word line for selecting the memory cell, each of said voltage supply circuits having a first input terminal supplied with a first voltage and a second input terminal supplied with a second voltage which is lower than the first voltage, each of said voltage supply circuits supplying the first voltage to the word line when the decode signal represents a selective state of the memory cell and supplying the second voltage to the word line when the decode signal represents a non-selective state thereof, the second voltage being set at a level which is equal to a level of the first voltage in a test mode where said semi-conductor memory device is tested.

2. A semiconductor memory device according to claim 1, further comprising a voltage switching circuit having an output terminal connected to the second input terminal of each of said voltage supply circuits, said voltage switching circuit switching the level of the second voltage to a level other than the level of the first voltage when said semiconductor memory device is in a normal operation mode, and switching the level of the second voltage to a level equal to the level of the first voltage when said semiconductor memory device is in the test mode.

3. A semiconductor memory device according to claim 2, wherein said voltage switching circuit comprises:

a first conductivity type transistor having a gate supplied with a switching signal for switching between the normal operation mode and the test mode, and a current path one end of which is supplied with the first voltage and another end of which is connected to the second input terminal of said plurality of voltage supply circuits; and a second conductivity type transistor having a gate supplied with the switching signal and a current path one end of which is connected to the second input terminal and another end of which is supplied with a third voltage, said first conductivity type transistor being turned on when the switching signal represents the test mode, and said second conductivity type transistor being turned on when the switching signal represents the normal operation mode.

4. A semiconductor memory device according to claim 2, wherein said voltage circuit comprises;

a first conductivity type transistor having a gate supplied with a switching signal for switching between the normal operation mode and the test mode, and a current path one end of which is supplied with a higher voltage than the first voltage and another end of which is connected to the second input terminal of said plurality of voltage supply circuits; and a second conductivity type transistor having a gate supplied with the switching signal and a current path one end of which is connected to the second input terminal and another end of which is supplied with a third voltage, said first conductivity type transistor being turned on when the switching signal represents the test mode, and said second conductivity type transistor being turned on when the switching signal represents the normal operation mode.

5. A semiconductor memory device according to claim 1, wherein each of said voltage supply circuits comprises:

a first conductivity type transistor having a gate supplied with the decode signal, and a current path one end of which is connected to the first input terminal and another end of which is connected to the word line; and a second conductivity type transistor having a gate supplied with the decode signal, and a current path one end of which is connected to the word line and another end of which is connected to the second input terminal.

6. A semiconductor memory device according to claim 1, wherein each of said voltage supply circuits includes a logic circuit having two input terminals and one output terminal and supplied with the first voltage and the second voltage, said input terminals being supplied with first and second decode signals and said output terminal being connected to the word line, said logic circuit outputting the first voltage from the output terminal when the first and second decode signals both represent the selective state and outputting the second voltage therefrom when at least one of the first and second decode signals represents a non-selective state, the second voltage being set at a level opposite to the level of the first voltage when said semiconductor memory device is in the normal operation mode, and to a level equal to the level of the first voltage in the test mode.

7. A device according to claim 6, wherein said logic circuit comprises:

first and second transistors of a first conductivity type and a first transistor of a second conductivity type whose current paths are connected in series between the first voltage and the second voltage, said first transistor of the first conductivity type and said first transistor of the second conductivity type having gates supplied with the first decode signal, said second transistor of the first conductivity type having a gate supplied with the second decode signal, and a connection node of said second transistor of the first conductivity type and said first transistor of the second conductivity type being connected to the word line; and a second transistor of the second conductivity type connected in parallel to the current path of said first transistor of the second conductivity type and having a gate supplied with the second decode signal, the second voltage being set at a level opposite to the level of the first voltage when said semiconductor memory device is in the normal operation mode, and to a level equal to the level of the first voltage in the test mode.

8. A device according to claim 1, wherein each of said voltage supply circuits comprises:

a first transistor of a first conductivity type having a gate supplied with the decode signal, and a current path one end of which is connected to the first input terminal and another end of which is connected to the word line;

a transistor of a second conductivity type having a gate supplied with the decode signal, and a current path one end of which is connected to the word line and another end of which is connected to the second input terminal; and a second transistor of the first conductivity type having a current path connected in parallel to the current path of said first transistor of the first conductivity type and a gate supplied with a switching signal for switching between a normal operation mode and a test mode, the gate of said second transistor of the first conductivity type being smaller in size than the gate of said first transistor of the first conductivity type.

9. A semiconductor memory device according to claim 1, wherein each of said voltage supply circuits includes an inverter circuit having a first P-channel transistor and a first N-channel transistor each having a drain connected to the word line and a gate supplied with a decode signal, said first N-channel transistor having a source supplied with the second voltage, and a voltage switching circuit which includes an inverter circuit having a second P-channel transistor and a second N-channel transistor each having a drain connected to the source of said first P-channel transistor and a gate supplied with a switching signal for switching between a normal operation mode and a test mode, said second P-channel transistor having a source supplied with the first voltage and said second N-channel transistor having a source supplied with a third voltage.

10. A semiconductor memory device according to claim 1, wherein each of said voltage supply circuit includes an inverter circuit having a first P-channel transistor and a first N-channel transistor each having a drain connected to the word line and a gate supplied with a decode signal, said first N-channel transistor having a source supplied with the second voltage, and a voltage switching circuit which includes an inverter circuit having a second P-channel transistor and a second N-channel transistor each having a drain connected to the source of said first P-channel transistor and a gate supplied with a switching signal for switching between a normal operation mode and a test mode, said second P-channel transistor having a source supplied with the first voltage and said second N-channel transistor having a source supplied with a third voltage which is lower than the second voltage, the word line being connected to an output terminal of said inverter circuit of each of said voltage supply circuits.

11. A semiconductor memory device according to claim 10, wherein the third voltage is equal to a fourth voltage which is lower than a ground potential by a threshold voltage of said first P-channel transistor and higher than a fifth voltage which is lower than the fourth voltage by a threshold voltage of said first N-channel transistor.

12. A semiconductor memory device according to claim 10, further comprising a third N-channel transistor connected in parallel to the current path of said first N-channel transistor of each of said voltage supply circuits and having a gate supplied with the switching signal, the gate of said third N-channel transistor being smaller in size than the gate of said first N-channel transistors.

13. A semiconductor memory device according to claim 1, further comprising a first external voltage input terminal connected to the second input terminal of each of said voltage supply circuits and supplied with a first external voltage, the first external voltage being set at the second voltage in a normal operation mode and at a voltage equal to the first voltage in the test mode.

14. A semiconductor memory device comprising:

a plurality of logic circuits for decoding an address signal, each of said plurality of logic circuits outputting a decode signal from an output terminal thereof to select a memory cell;

a plurality of voltage supply circuits each having an input terminal connected to the output terminal of a corresponding one of said plurality of logic circuits and an output terminal connected to a word line for selecting the memory cell, each of said plurality of voltage supply circuits having a first input terminal supplied with a first voltage and a second input terminal supplied with a second voltage, each of said plurality of voltage supply circuits supplying the first voltage to the word line when the decode signal represents a selective state of the memory cell and supplying the second voltage to the word line when the decode signal represents a non-selective state thereof; and a voltage switching circuit having an output terminal connected to the second input terminal of each one of said plurality of voltage supply circuits, said voltage switching circuit switching a level of the second voltage to a level other than a level of the first voltage when said semiconductor memory device is in a normal operation mode, and switching the level of the second voltage to a level equal to the level of the first voltage when said semiconductor memory device is in a test mode.

15. A semiconductor memory device comprising:

a plurality of logic circuits for decoding an address signal, each of said plurality of logic circuits outputting a decode signal from an output terminal thereof to select a memory cell;

a plurality of voltage supply circuits each having an input terminal connected to the output terminal of a corresponding one of said plurality of logic circuits and an output terminal connected to a word line for selecting the memory cell, each of said plurality of voltage supply circuits having a first input terminal and a second input terminal, said first input terminal being supplied with a first voltage; and a first external voltage input terminal connected to the second input terminal of each of said plurality of voltage supply circuits and supplied with an external voltage, said external voltage being set at a second voltage lower than the first voltage in a normal operation mode and at a voltage higher than the first voltage in a test mode, each of said plurality of voltage supply circuits outputting the voltage supplied to the first input terminal when the decode signal represents a selective state of the memory cell, and outputting the voltage supplied to the second input terminal when the decode signal represents a non-selective state of the memory cell.

16. A semiconductor memory device according to claim 15, further comprising a second external voltage input terminal grounded and formed close to the first external voltage input terminal, said second external voltage input terminal being connected to the first external voltage input terminal in the normal operation mode.

17. A semiconductor memory device comprising:

a plurality of logic circuits for decoding an address signal, each of said plurality of logic circuits outputting a decode signal from an output terminal thereof to select a memory cell;

a plurality of voltage supply circuits each having an input terminal connected to the output terminal of a corresponding one of said plurality of logic circuits and an output terminal connected to a word line for selecting the memory cell, each of said plurality of voltage supply circuits having a first input terminal and a second input terminal, said second input terminal being connected to a ground potential; and a first external voltage input terminal connected to the first input terminal of each of said plurality of voltage supply circuits and supplied with an external voltage, said external voltage being set at a voltage higher than the ground potential in a normal operation mode and at a voltage lower than the ground potential in a test mode, each of said plurality of voltage supply circuits outputting the voltage supplied to the first input terminal when the decode signal represents a selective state of the memory cell, and outputting the voltage supplied to the second input terminal when the decode signal represents a non-selective state of the memory cell.

18. A semiconductor memory device according to claim 17, further comprising a second external voltage input terminal formed close to the first external voltage input terminal and supplied with a third voltage higher than the ground potential, said second external voltage input terminal being connected to the first external voltage input terminal in the normal operation mode.

* * * * *